United States Patent [19]

Sharon

[11] 4,448,240
[45] May 15, 1984

[54] TELESCOPING THERMAL CONDUCTION ELEMENT FOR COOLING SEMICONDUCTOR DEVICES

[75] Inventor: Andre Sharon, Arlington, Mass.
[73] Assignee: International Business Machines Corporation, Armonk, N.Y.
[21] Appl. No.: 450,884
[22] Filed: Dec. 20, 1982
[51] Int. Cl.³ .............................................. F28F 7/00
[52] U.S. Cl. .................................. 165/80 C; 165/185
[58] Field of Search .................. 165/80 B, 185, 80 C, 165/80 A, 82, 172, 141, 166; 174/16 HS; 357/79, 81, 81 A, 81 B, 81 C, 82; 361/386, 381

[56] References Cited
U.S. PATENT DOCUMENTS

| | | | |
|---|---|---|---|
| 1,129,704 | 2/1915 | Merie | 165/166 |
| 3,844,341 | 10/1974 | Bimshas | 165/185 |
| 3,993,123 | 11/1976 | Chu et al. | 165/104.33 |
| 4,034,468 | 7/1977 | Koopman | 174/16 HS |
| 4,081,825 | 3/1978 | Koopman | 357/81 |
| 4,156,458 | 5/1979 | Chu et al. | 165/81 |

Primary Examiner—William R. Cline
Assistant Examiner—Peggy A. Neils
Attorney, Agent, or Firm—Wolmar J. Stoffel

[57] ABSTRACT

A thermal bridge element for use in a semiconductor package to conduct heat from a semiconductor device to a cold plate or cap located in close proximity to the device having a first plate to be placed in contact with a semiconductor device surface, a first spiral strip of heat conductive material joined to the first plate, a second plate to be placed in contact with a heat sink surface or cap spaced from the device surface, and a second spiral strip of thin heat conductive material interleaved with the first spiral strip and in partially overlapping telescoping relation, the second spiral strip joined to the second plate, and a means to bias the first and second plate outwardly relative to each other.

7 Claims, 3 Drawing Figures

TELESCOPING THERMAL CONDUCTION ELEMENT FOR COOLING SEMICONDUCTOR DEVICES

DESCRIPTION

1. Techical Field

This invention relates to techniques and structure for the dissipation of thermal energies generated by semiconductors during operation. More particularly, the present invention relates to heat conduction elements for cooling semiconductor devices in integrated circuit package assemblies where the devices are mounted on the substrate and the caps or heat sinks are mounted in close proximity to the devices.

The high circuit densities in modern integrated circuit semiconductor devices require that the heat generated by their operation be efficiently removed in order to maintain the temperature of the devices within limits that will keep the operating parameters of the devices within predetermined ranges, and also prevent destruction of the device by overheating. The problems of heat removal are increased when the devices are connected to the supporting substrate with solder terminals that electrically connect the device to appropriate terminals on the substrate. On such solder bonded devices, the heat transfer that can be accomplished through the solder bond is limited, as compared to backbonded devices. Cooling of the semiconductor devices can be achieved by immersing the devices in a suitable liquid coolant. However, these cooling techniques can result in corrosion of the device and substrate metallurgy and also present problems if the package must be reworked i.e., devices rejoined or substituted. Cooling can also be achieved by providing a conductive link of material, such as a conductive piston or spring element between the device and cap or cold plate. These elements must be capable of forming a good interface contact over as large an area as possible in order to maintain a low thermal resistance. With cooling techniques, forming such interfaces is difficult because the devices may be tilted, resulting in an unsatisfactory point or line contact. In general, cooling pistons must be used in an atmosphere of inert gas with a higher heat conductivity than air, or a grease or other conformal means be provided at the piston end—device interface. Another disadvantage is that the pistons may be subject the devices being cooled to shock when the package is subjected to inertial forces. Spring elements for thermal conduction between the device and cold plate are known. The prevalent problem is designing sufficiently heavy springs that will efficiently conduct heat and yet not impose forces on the device that will crack or chip them. The consideration becomes more severe as the tolerance of the gap between the devices is increased.

2. Background Art

The following prior art references relate to various structures for removing heat from solder bonded semiconductor devices.

U.S. Pat. No. 3,993,123 discloses a semiconductor package in which a movable heat conductive piston is placed in contact with the backside of a solder bonded semiconductor device to conduct heat away from the device to a cooling plate.

U.S. Pat. No. 4,034,468 and 4,081,825 both disclose semiconductor packages wherein a low melting point solder is provided in contact with the backside of a solder bonded device and a module cap to remove heat from the device.

U.S. Pat. No. 4,156,458 discloses a cooling arrangement including a flexible heat conductive metallic foil bundle extends between the back of the device and the heat sink.

IBM Technical Disclosure Bulletin Vol. 21 No. 3 Aug. 1978 P. 1141 discloses a thermal shunt element disposed between a solder bonded semiconductor device and a module cap comprising a rectangular center portion and a pair of diversion wings that contact the cap.

IBM TDB Vol. 20 No. 6 Nov. 1977 P. 2214 and U.S. Pat. No. 4,146,458, issued May 29, 1979 disclose a plurality of pre-formed sheets of aluminum foil nested together and disposed between solder bonded semiconductor devices in a housing to remove heat from the devices.

IBM TDB Vol. 19 No. 12 May 1977 P. 4683 discloses a thermal conduction bridge element between a solder bonded semiconductor device in a cap which features a plurality of interleaved relatively slidable fins. Application Ser. No. 249,262 filed Mar. 30, 1981 assigned to the same assignee of this application discloses a thermal bridge for conducting heat from the device to a cover which includes a relatively thick metal sheet provided with cuts that define at least one tab element.

Application Ser. No. 289,025, filed July 12, 1982 assigned to the same assignee of this application discloses a thermal bridge element for conducting heat from a device to a cover or heat sink which includes a plurality of flexible telescoping fins that accommodate for device tilt and provide excellent heat conduction.

Disclosure of Invention

The invention is an improved cooling element adapted to be positioned between a solder bonded semiconductor device and a module cap or cold plate to form a heat conduction bridge between the device and cap or cold plate. The cooling element has a first plate adapted to be placed in contact with semiconductor device, a first spiral strip of heat conductive material joined to the first plate, a second plate to be placed in contact with a heat sink surface or cap surface, and a second spiral strip of thin heat conductive material interleaved with the first spiral of heat conductive material in partially overlapping and telescoping relation. A means can be provided to bias the first and second plate outwardly relative to each other to obtain a firm contact with the device and a heat sink or cap. The thermal bridge element of this invention is sufficiently flexible to allow the plate surfaces to intimately contact the backside of the device and the cover or cap and therefore achieve a low overall thermal resistance that permits heat to be effectively transferred from the device to the cap or heat sink.

BRIEF DESCRIPTION OF THE DRAWINGS

The details of my invention will be described in connection with the accompanying drawings in which.

BEST MODE FOR CARRYING OUT THE INVENTION

Figure 1:
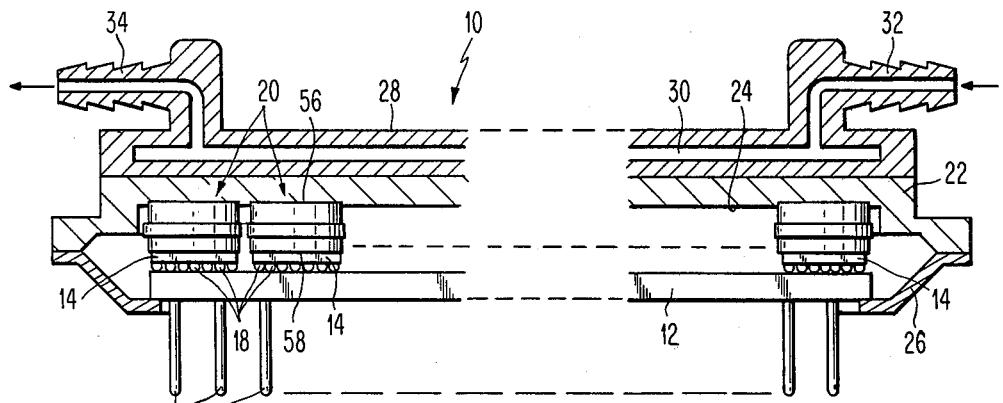
FIG. 1 is an elevational view in broken section illustrating a semiconductor package including semiconductor devices solder bonded to the substrate, and a cooling plate with thermal bridge elements disposed in operative cooling relation to the devices and cold plate.

Referring to the drawings, FIG. 1 illustrates a semiconductor package 10 and the association of the thermal conduction element 20 of my invention. Package 10 has a dielectric substrate 12 containing a metallurgy pattern, either within or on the top surface that interconnects semiconductors 14 with each other and to pins 16 protruding from the bottom surface of substrate 12. Devices 14 are joined to the metallurgy pattern in or on substrate 12 by solder bonds 18. A cover element 22 is positioned over devices 14 with a surface 24 in spaced relation to the top surface of devices 14. A flange member 26, secured or brazed to substrate 12, is joined to cap 22. A cold plate 28 with packages 30 and inlet 32 and outlet 34 is mounted over cap 22 for the purpose of removing heat from the cap and from devices 14. In use, a cooling fluid is introduced into inlet 32 and removed through outlet 34. Alternatively, cap 22 can be provided with fins or the like as an alternative to cooling plate 28. The thermal element 20 of my invention provides a thermal path from devices 14 to the cap having an overall low thermal resistance that, in use, will provide dependable consistent cooling of the devices during operation.

Figure 2:
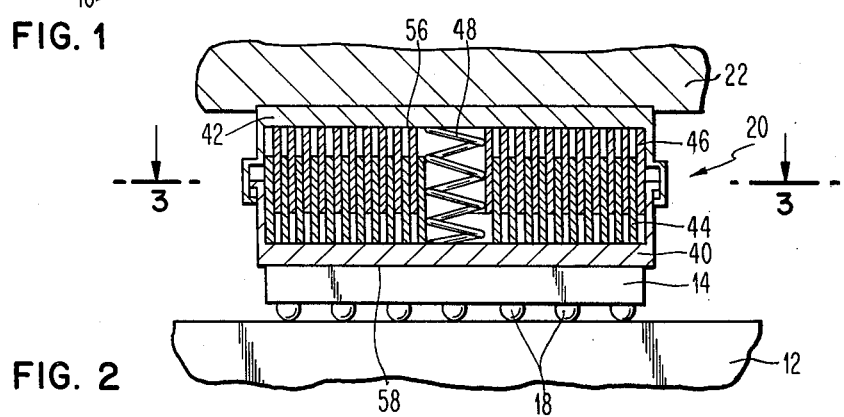
FIG. 2 is a side elevational view in sections in enlarged scale that illustrates the relationship of the elements of the bridge element of the invention.
Figure 3:
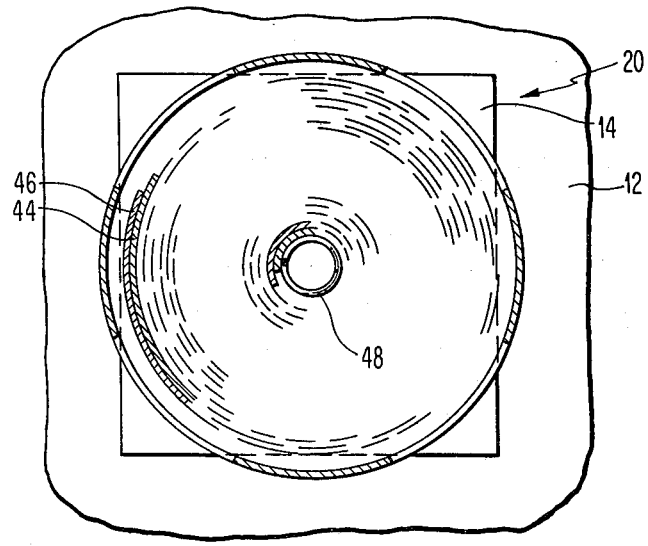
FIG. 3 is a sectional view taken on line 3—3 of FIG. 2.

Referring now to FIGS. 2 and 3 of the drawings, there is depicted a preferred specific embodiment of the thermal bridge element 20 of the invention. Element 20 has a first plate 40 in contact with semiconductor 14 that is connected to substrate 12 with solder connections 18. Element 20 has a second plate 42 of heat conductive metal, preferably copper, in contact or affixed to the cover 22. Secured to first plate 40 is a first spiral strip 44 of thin heat conductive material, preferably copper. A second spiral strip 46 of thin heat conductive material, preferably copper, mounted on plate 42. As indicated in the figs. of the drawings, the spiral strips of material 44 and 46 are interleaved and are mounted in telescoping relation. Coils 44 and 46 are formed of relatively thin highly heat conductive metal such as copper, silver and potentially aluminum. The thickness of the strips of coils 44 and 46 is small in order to achieve a large area of contact between the coils. The thickness can be from 0.1 to 10 mils, more preferably from 1 to 5. Most preferably the coils of material are made of high purity copper with a thickness of 2 mils. The coils are secured to the respective plates by any suitable manner as for example, by soldering, or brazing. The coils 44 and 46 serve as a very efficient heat conductor adapted to transfer the heat from the device to the cold plate since the area of contact is very large and the telescoping relation adapt the plates 40 and 42 to adapt to the surfaces of the device and cold plate in the event that the devices are slightly misaligned, i.e. tilted. Thermal elements of the type described are capable of achieving a thermal resistance of 1° per watt for a 4.5 mil square chip. A means is provided for biasing the plates 40 and 42 outwardly in contact with the device and cap or cold plate. Preferably, this means is a coil spring 48 located centrally in coils 44 and 46. Also provided is a suitable restraining means to prevent the plates from separating beyond the telescoping range of the coils 44 and 46. This restraining means can be any suitable type of connection preferably of resilient clips 50 joined to the plates 40 and 42.

An improved aspect of this invention is the ease by which the telescoping coils can be fabricated into the thermal connection element of the invention. In fabricating the thermal bridge element 20 a pair of elongated strips of metal are placed in overlying and partially overlapping relation, and the strips rolled into a coil having the configuration shown most clearly in FIG. 3. The metal plates 40 and 42 are then joined to the coils by soldering, brazing or other suitable means. The coils can be wrapped around the coil spring 48 or wrapped around a blank and the coil spring inserted after they have been formed The restraining means is then suitably joined to the plates and the thermal bridge element is ready for assembly into any suitable type of package, as for example the package shown in FIG. 1. The thermal resistance between the device and the element and also between the plate and the cap can be reduced by soldering or through the use of a thermal grease indicated by 56 and 58.

While the invention has been illustrated and described with reference to preferred embodiments thereof, it is to be understood that the invention is not limited to the precise construction herein disclosed and the right is reserved to all changes and modifications combing within the scope of the invention as defined in the appended claims.

I claim:

1. An extensible bridge element for use in a semiconductor package to conduct heat from a semiconductor device to a cold plate located in close proximity to the device comprising a first plate to be placed in contact with a semiconductor device surface a first spiral strip of thin heat conductive material joined along an edge to said first plate, a second plate to be placed in contact with a heat sink surface spaced from said device surface, a second spiral strip of thin heat conductive material interleaved with said first spiral strip in a laterally displaced overlapping and slideably contacting telescoping relation, said second spiral strip joined along an edge to said second plate, and means to bias said first and said second plates outwardly relative to each other, said element capable in use of adjusting to spacing variations between the device surface and heat sink surface.

2. The thermal bridge element of claim 1 wherein said plates and spiral strips are formed of copper or alloys that include a major portion of copper.

3. The thermal bridge element of claim 2 wherein said plates and spiral strips are formed of an alloy consisting of 99.8% Cu and 0.2% zirconium.

4. The thermal bridge element of claim 1 wherein said first and second plates are joined to said first and second thin strips by soldering.

5. The thermal bridge element of claim 1 wherein the thickness of said first and said second thin strips is in the range of 0.1 to 10 mils.

6. The thermal bridge element of claim 1 wherein said means to bias said first and said second plates outwardly is a centrally located coil spring.

7. The thermal bridge element of claim 6 which further includes a restraining means to prevent separation of said first and said second overlying thin strips.

* * * * *